US008952715B2

(12) United States Patent
Gillispe et al.

(10) Patent No.: US 8,952,715 B2
(45) Date of Patent: Feb. 10, 2015

(54) WIRELESS CURRENT-VOLTAGE TRACER WITH UNINTERRUPTED BYPASS SYSTEM AND METHOD

(71) Applicant: Stratasense LLC, San Francisco, CA (US)

(72) Inventors: Kellen Gillispe, San Francisco, CA (US); Peter Wrisley, Hollis, NH (US)

(73) Assignee: Stratasense LLC, San Francisco, CA (US)

( * ) Notice: Subject to any disclaimer, the term of this patent is extended or adjusted under 35 U.S.C. 154(b) by 209 days.

(21) Appl. No.: 13/676,825

(22) Filed: Nov. 14, 2012

(65) Prior Publication Data

US 2014/0132301 A1    May 15, 2014

(51) Int. Cl.
*G01R 31/26*      (2014.01)
*G01R 31/40*      (2014.01)

(52) U.S. Cl.
CPC .......... *G01R 31/405* (2013.01); *G01R 31/2605* (2013.01); *G01R 31/2603* (2013.01)
USPC .................................................. 324/761.01

(58) Field of Classification Search
CPC ........... G01R 31/2603; G01R 31/2605; G01R 31/405
USPC ..................... 324/761.01, 537, 500
See application file for complete search history.

(56) References Cited

U.S. PATENT DOCUMENTS

| | | | |
|---|---|---|---|
| 4,129,823 A | 12/1978 | Van der Pool et al. | |
| 4,163,194 A * | 7/1979 | Ross | 324/761.01 |
| 4,184,111 A | 1/1980 | Lovelace et al. | |
| 4,258,503 A | 3/1981 | Bales | |
| 4,456,880 A | 6/1984 | Warner et al. | |
| 5,945,839 A * | 8/1999 | Hyvarinen | 324/761.01 |
| 5,955,885 A * | 9/1999 | Kurokami et al. | 324/426 |
| 6,057,665 A | 5/2000 | Herniter et al. | |
| 6,111,767 A | 8/2000 | Handleman | |
| 6,639,421 B1 | 10/2003 | Yoshino et al. | |
| 7,087,332 B2 | 8/2006 | Harris | |
| 7,272,760 B2 | 9/2007 | Tan et al. | |
| 7,308,950 B2 | 12/2007 | Faatz et al. | |
| 7,333,916 B2 | 2/2008 | Warfield et al. | |
| 7,667,494 B2 | 2/2010 | Andreev et al. | |
| 7,906,980 B1 | 3/2011 | Cravey | |
| 7,919,953 B2 | 4/2011 | Porter et al. | |
| 2006/0103371 A1 * | 5/2006 | Manz | 324/158.1 |
| 2006/0123287 A1 | 6/2006 | Tan et al. | |
| 2008/0306700 A1 | 12/2008 | Kawam et al. | |

(Continued)

*Primary Examiner* — Hoai-An D Nguyen
(74) *Attorney, Agent, or Firm* — Steptoe & Johnson LLP

(57) ABSTRACT

A measurement instrument capable of electrically isolating the connected photovoltaic ("PV") module in an array of PV modules to perform a health diagnosis including of current versus voltage measurements on the attached device by using a resistive load to acquire the current-voltage ("IV") curve in the positive power quadrant of the module. The instrument is capable of switching a charge storage element into the array during the period when the solar module is under test to provide uninterrupted electrical power to the PV array. The measurement instrument contains a battery and charger allowing the device to run from the connected PV module's energy. The instrument contains a microprocessor to allow a high degree of configuration through software, including altering the speed of an IV sweep, the interval between sweeps, and integrating temperature and tilt measurements. The instrument is equipped with low power radio devices to communicate wirelessly, further negating the need for a common ground.

20 Claims, 3 Drawing Sheets

(56) References Cited

U.S. PATENT DOCUMENTS

| | | | |
|---|---|---|---|
| 2010/0034455 A1* | 2/2010 | Harada et al. ............. | 382/141 |
| 2010/0171482 A1 | 7/2010 | Ye et al. | |
| 2011/0146746 A1 | 6/2011 | Chen et al. | |
| 2011/0273163 A1 | 11/2011 | Jungerman et al. | |
| 2012/0049879 A1 | 3/2012 | Crites | |
| 2012/0075898 A1 | 3/2012 | Sigamani et al. | |

* cited by examiner

WIRELESS CURRENT-VOLTAGE TRACER WITH UNINTERRUPTED BYPASS SYSTEM AND METHOD

TECHNICAL FIELD

The present invention relates to a solar power diagnostic tool which temporally correlates the quantification of photovoltaic ("PV") energy production and performance by measuring the current-voltage ("IV") curve, while providing continuous power to the load when the module is under test, and communicates wirelessly over low power radio devices.

BACKGROUND

Photovoltaic systems play a critical role in worldwide energy production. The industry that supports the development and consumption of these systems continues to innovate and develop new technologies which will benefit tremendously from enhanced measurement and evaluation solutions for all stages of research, certification, development, implementation, and maintenance. Current solutions typically require considerable wiring, are difficult to configure and often cannot be left in the field to collect data in real environments or while connected to inverters or the grid.

SUMMARY

The solar power diagnostic tool which simultaneously measures the IV curve for a photovoltaic module under sunlight, or a group of connected modules in series or parallel, and while providing uninterrupted electrical energy to the subsequent solar modules while testing is in progress. Accordingly, this solar power diagnostic tool may provide an IV tracer that allows for the continuous power supply to the load when the solar panel is under test. The system may allow for this testing to be fully automated while also not requiring power generation downtime, to allow solar arrays to continuously operate while their health is being constantly monitored.

The device may include features that are specifically designed to provide flexibility and low impact integration into an array, and may have the unique capability to perform the core function of measuring an IV without disrupting the power flow through the array. The device also may have the ability to alter the speed of an IV sweep, which allows greater flexibility to test a wide range of PV modules with variation in things such as materials, cell configurations, and technical processes. Accordingly, this can make different IV sweep speeds more accurate and informative depending on the characteristics of the module under test. By allowing flexibility to also change the interval between IV sweeps, the amount of power used by the instrument can be weighed against the amount of data desired. The instrument may also be designed to use the lowest amount of power possible, while providing the greatest amount of accuracy and control for testing.

The solar power diagnostic tool may include a custom circuit which stores energy in a capacitor, which is used to power the load when the device solar panel is under test. This backup power source may also be a battery. The system may include a transceiver, transistor, capacitor and microcontroller. The transceiver may be wireless. The transistors may be high power. The capacitor may be high power. The system may further be utilized by products that need an IV curve tester, which also require constant power supply to the electrical load. The system may also be used to discharge a battery, and to monitor the unit throughout the discharge process.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The details of one or more embodiments are set forth in the following detailed description of the invention and the accompanying drawings. Other objectives, features, and advantages of the invention will be more readily understood upon consideration of the following Detailed Description of the invention, taken in conjunction with the accompanying drawings, and with the claims.

DESCRIPTION OF THE DRAWINGS

The present invention is further described in the detailed description which follows, in reference to the noted plurality of drawings by way of non-limiting examples of certain embodiments of the present invention, in which like numerals represent like elements throughout the several views of the drawings, and wherein.

DETAILED DESCRIPTION

Figure 1:
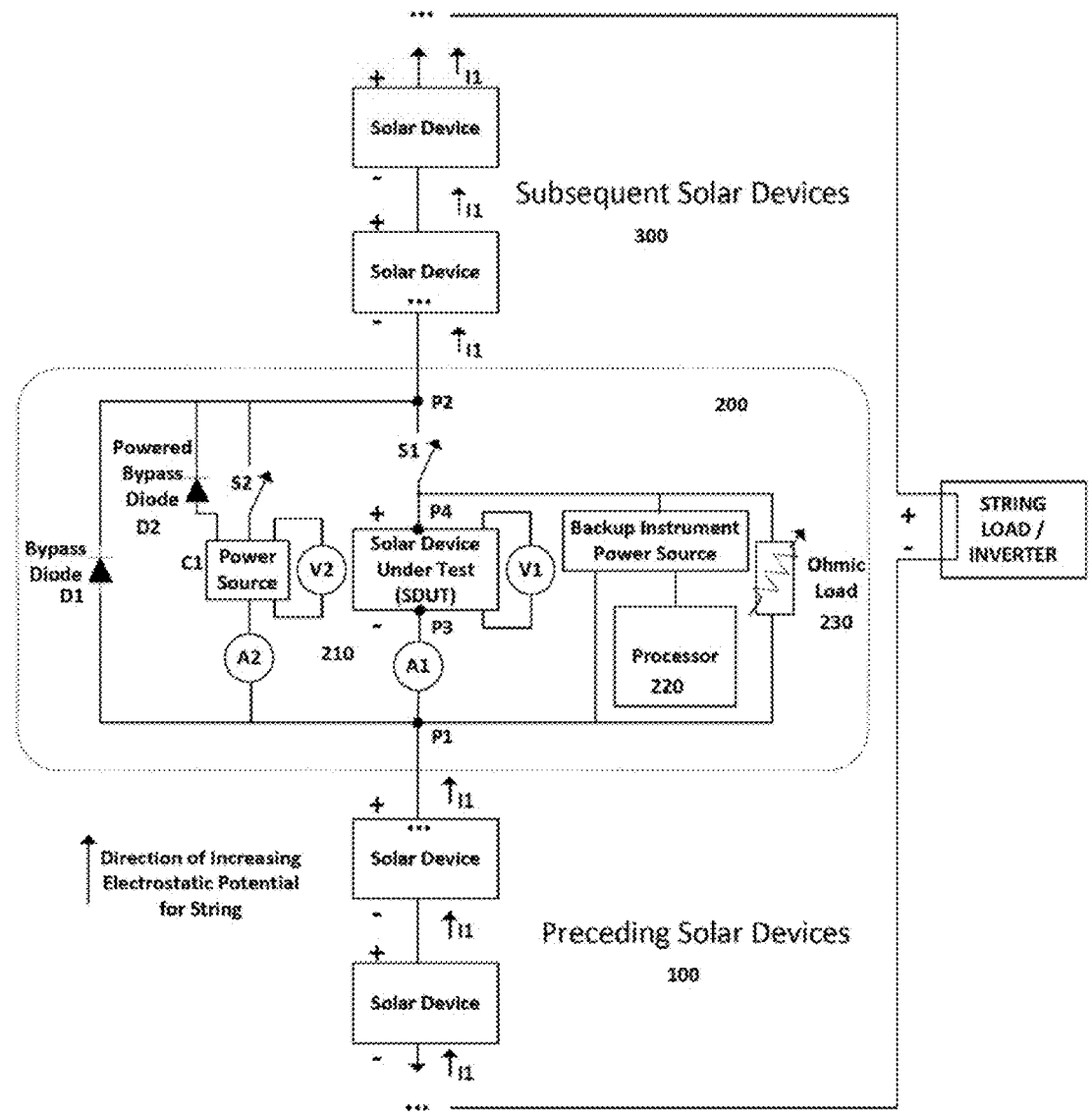
FIG. 1 depicts a block diagram of the invention connected with series connected solar devices.

A detailed explanation of the system and method according to the preferred embodiments of the present invention are described below.

Manufacturers and operators of power generation devices such as solar PV modules need to perform analysis on the quality and reliability of their devices while they are operating in the field. This includes comparisons of theoretical versus actual maximum power, and the ability of the device to retain these characteristics over time. Current solutions typically require considerable wiring, are difficult to configure and often cannot be left in the field to collect data in real environments or while connected to inverters or the grid.

Furthermore, existing measurements of photovoltaic systems are often performed by inverters, and increasingly by DC to DC optimizers embedded on each module. The IV curve is a critical measurement because it can allow insights into such things as maximum power output, efficiency, shunt resistance, series resistance, recombination current, diode quality factor, the presence of errors in the module circuitry, and the impacts on the module of shading or soiling. Measured over time and matched with environmental measurement data such as irradiance and temperature, these measurements provide dramatically more insights into the module's performance and degradation. These existing measurement devices typically do not have the capability to capture the full power quadrant IV curve of an individual solar module.

Careful time-correlated quantification of photovoltaic energy production and performance in outdoor arrays and test sites can benefit the PV industry in numerous ways. Existing IV measurement instruments are typically designed for taking one-time measurements after the module or string of modules has been disconnected from the array. Additionally, existing inverter technology is often highly sophisticated and can include safety features and performance enhancement features that could be negatively impacted by devices that switch a module out of the array without providing uninterrupted electrical power to the PV array. Furthermore, theses existing systems require one to physically sever panel connections for purposes of testing, which results in an energy loss.

However, a compact, simple implementation and robust design would greatly boost the abundance of data collected in the field from PV devices. More field data will help replace less reliable indoor accelerated lifetime testing and give a better predictor of solar module lifetime. The real world data could also be used to enhance the models constructed to extrapolate predicted performance from lab tests. Also, continuous monitoring will maximize return-on-investment for array owners due to increased response of failure conditions, and moreover, will allow for more granular detection further pinpointing the specific device responsible for the failure in underperforming arrays.

The various solar power diagnostic methods, and systems described herein can be implemented in part or in whole using computer-based systems and methods. Additionally, computer-based systems and methods can be used to augment or enhance the functionality described herein, increase the speed at which the functions can be performed, and provide additional features and aspects as a part of or in addition to those described elsewhere in this document. Various computer-based systems, methods and implementations in accordance with the described technology are presented below.

Referring to FIG. 1, the solar power diagnostic tool may acquire current-voltage ("IV") curve traces of a solar power generation device. The solar power diagnostic tool may include a processor 220, a resistive load 230, a backup power source 240, a switch electrically connected to the solar power generation device and the backup power source, a voltage measurement device, a current measurement device, an accelerometer and a communications device. The processor 220 may be a microcontroller, and may control the process, dataflow and timing of the solar power diagnostic tool.

The backup power source 240 may store energy to emulate a solar power generation device under test 210 and for providing power to subsequent power generation devices 300. The backup power source 240 may include a capacitor, a battery or a transistor. The solar power diagnostic tool may include a waterproof assembly containing circuitry and the backup power source. The solar power diagnostic tool may include circuitry that resides in a combiner box or enclosure other than a waterproof assembly. The switch may switch power between the solar power generation device and the backup power source. The voltage measurement device may measure the voltage of the solar power generation device under test 210 as the resistive load 230 is changing the voltage and current that the solar power generating device is operating under. The current measurement device may measure the current of the solar power generation device under test 210 as the resistive load is changing the voltage and current that the solar power generation device is operating under. The current may be measured using a Hall effect. The accelerometer may measure the orientation of the solar power diagnostic tool.

The resistive load of the solar power diagnostic tool may be ohmic. A transistor may be utilized to create the resistive load. High power transistors may be used to create a variable ohmic load to perform the IV sweep of the solar panel. The resistive load may include field-effect transistors (FETs), which may cause the solar power generation device under test to operate in the power quadrant from an open-circuit to within a small limit of a short-circuit. The resistive load may include capacitors.

The solar power generation device may include a group of solar photovoltaic modules that are connected in series, or may include a group of solar photovoltaic modules that are connected in parallel. The solar power diagnostic tool may include a bypass diode, which may pass solar string current if the solar power diagnostic tool fails in an open-circuit state. The solar power diagnostic tool may include inputs for temperature sensing devices for ambient temperature and module temperature.

The processor may carefully charge the backup power source slowly so as not to significantly detract from the energy being supplied to the electrical load. Once the backup power source 240 is charged, the processor 220 may switch the backup power source 240 into the resistive load 230, and then may switch the solar power generation devices under test 210 out of the resistive load 230, so that the electrical power generation is never severed. The solar power diagnostic tool may be fully automated, and may provide continuous power supply to the resistive load 230 while the solar power generation device is under test. After the IV curve of the solar panel has been swept, the processor 220 may connect the solar panel back to the load. A ohmic load, capacitive or inductive load may be used to sweep the IV curve.

The solar power diagnostic tool may include a communications device to allow for data transport. The data transport may occur over an IEEE 802.15.4 or 80.11 communication protocol. The communications device may be a wireless transceiver. The processor 220 may communicate with a high power transistor acting as the resistive load 230, and may walk the solar panel's operating point through a resistance window supplied from the high power transistor, which may be in a range between milliohms and mega ohms. The communications device may be a hardwired communication link.

The solar power diagnostic tool may utilize two switches ("S1" and "S2") in a series and shunt configuration with the subsequent and measured solar power generation device under test ("SDUT"). The negative and positive polarity of SDUT may be connected electrically to points P3 and P4, respectively. The negative polarity of the subsequent solar devices at higher electrostatic potential may be connected electrically to point P2 while the positive polarity of the preceding solar devices at lower electrostatic potential is connected to point P1. SDUT may be in series switch S1, and S2 may be in parallel (shunt) with S1 and SDUT combined.

Figure 2:
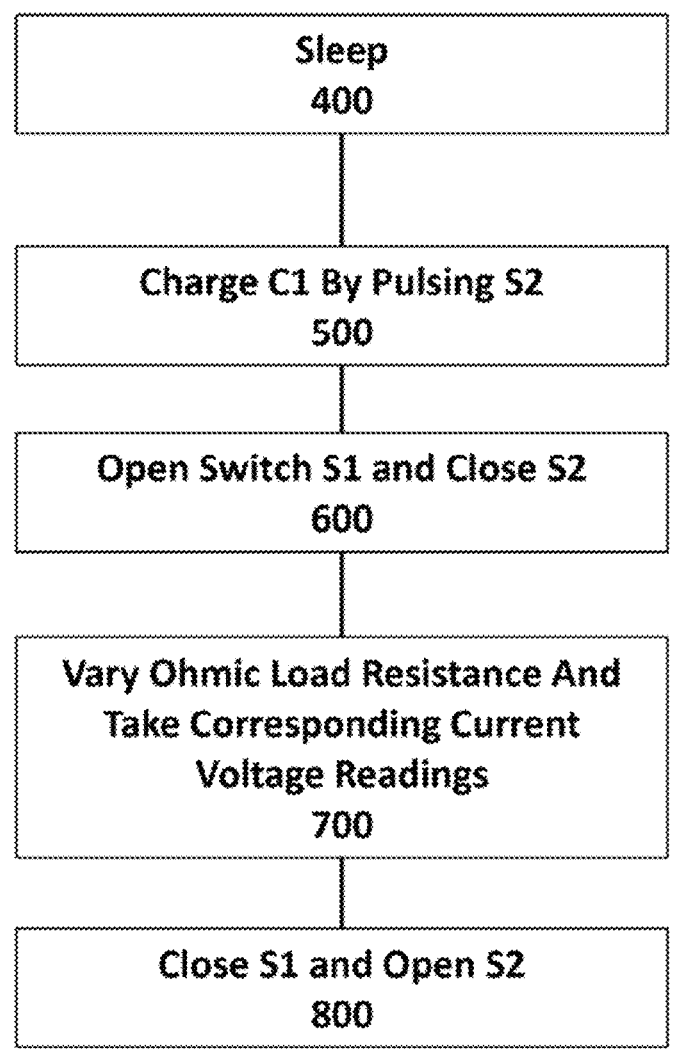
FIG. 2 provides a flow diagram for the typical states the invention passes through in monitoring a solar power generation device and performing one IV curve measurement

Referring to FIG. 2, the solar power diagnostic tool may operate under and transition between three primary states, and with one failure state in the event that the system malfunctions. These states may include a sleep state 400, a charging bypass power supply state 500, which may be a pre-measurement state, a tracing current-voltage (IV) curve state 600, 700, 800, which may be the measurement state, and a bypass diode state, which may be the instrument failure state.

During the sleep state, the solar power diagnostic tool may draw just enough power to keep its internal batteries charged through a linear regulator designed to source a trickle DC current over an especially wide operating voltage range. In this state, switch (S1) may be closed, and when solar radiation is present, the solar power generation device under test ("SDUT"). may generates a positive voltage and passes charge from (P1) to (P2) and through to subsequent solar devices. In this state, (A1 and V1) may be measured on user-defined intervals. These values may represent the string current (A1) and solar device operating voltage (V1) which can be used to determine power generation from the SDUT During pre-measurement charging bypass power supply state, the bypass charge storage element (C1) may be below the voltage of the SDUT, which may be undesirable for the measurement state, and thus (C1) may acquire charge in this pre-measurement charging bypass power supply state through the pulsation of switch (S2). The pulsation may include pulse-width modulation. Charging may be complete when the voltage across (V2) is equal to (V1). (A2) may be used to monitor the rate of charging, and may actively control feedback to pulsation of S2.

The measurement tracing current-voltage curve state is when the current-voltage curve may be measured and may be triggered on a user-defined periodic interval when switch (S1) is opened, (S2) is closed changing the string current (I1) to flow from the preceding solar device to the subsequent device through (C1) instead of SDUT. Simultaneously, the ohmic load of the connected solar device may be varied to walk the current-voltage operating points for SDUT. At each point the voltage and current readings (A1 and V1) may be stored in a microprocessor for later transmission. When the fullest spectrum of resistance has been swept by the ohmic load, and a series of A1 and V1 readings have been taken, (S1) may be closed and the charging bypass power supply stage may commence.

The bypass diode state may only be triggered in the event that a failure inside the instrument between points P1 and P2 creates a power sink, which may cause the bypass diode to turn on and route charge around the instrument. This feature may ensure that an instrument failure does not compromise the entire string current.

Figure 3:
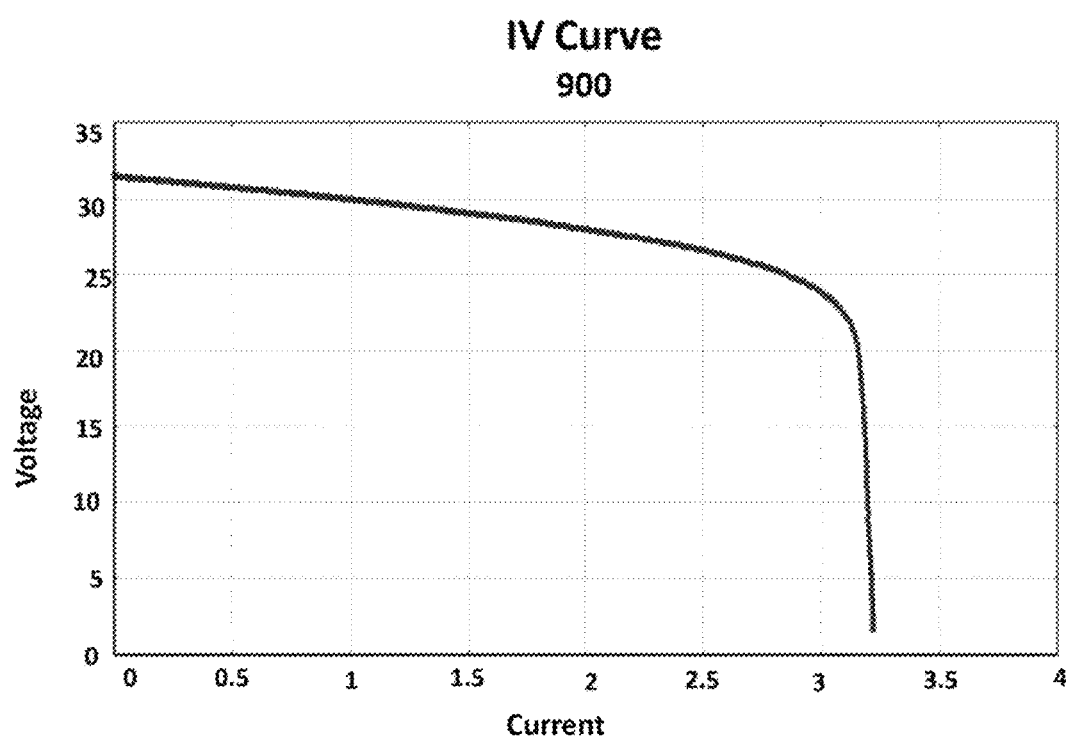
FIG. 3 depicts an IV curve captured by the solar power diagnostic tool.

Referring to FIG. 3, an IV curve 900 may be swept while simultaneously allowing continuous power supply to the load when the solar panel is under test. The processor 220 may communicate with a high power transistor acting as the resistive load 230, and may walk the solar panel's operating point through a resistance window supplied from the high power transistor, which may be in a range between milliohms and mega ohms. The communications device may be a hardwired communication link.

A method for acquiring current-voltage (IV) curve traces of a solar power generation device may include charging a backup power source until the backup power source has a voltage equal to a solar power generation device under test, in a charging mode. The solar power diagnostic tool may draw just enough power to keep an internal power source of the solar power generation device charged, in a standby mode. A software trigger may be defined that may occur at a regular interval and identifies a solar power diagnostic tool to perform a next step. A switch event so that the current from the backup source in a solar power diagnostic tool may flow to a next device in a string of solar modules, and current from the solar power diagnostic tool may flow through the solar power diagnostic tool rather than to the string of solar modules, may be performed. A high power variable resistance at a speed determined by the processor may be varied from open circuit to short circuit, while taking readings of the current-voltage operating points of the solar power generation device under test, and storing data for transmission. A switch event may be performed so that the current from the solar power generation device under test may be reconnected to the string of solar modules and the current form the backup power source of the solar power diagnostic tool may be disconnected from the string of solar modules. The steps of this method may be repeated until the solar power diagnostic tool is disconnected or turned off.

While particular embodiments of the invention have been illustrated and described in detail herein, it should be understood that various changes and modifications might be made to the invention without departing from the scope and intent of the invention. The embodiments described herein are intended in all respects to be illustrative rather than restrictive. Alternate embodiments will become apparent to those skilled in the art to which the present invention pertains without departing from its scope.

From the foregoing it will be seen that this invention is one well adapted to attain all the ends and objects set forth above, together with other advantages, which are obvious and inherent to the system and method. It will be understood that certain features and sub-combinations are of utility and may be employed without reference to other features and sub-combinations. This is contemplated and within the scope of the appended claims.

The invention claimed is:

1. A solar power diagnostic tool for acquiring current-voltage (IV) curve traces of a solar power generation device under test comprising:
    a processor for controlling the process, dataflow and timing of the solar power diagnostic tool;
    a resistive load;
    a backup power source for storing energy to emulate a solar power generation device under test and for providing power to subsequent solar power generation devices when the IV curve of the solar power generation device under test is being swept;
    a switch electrically connected to the solar power generation device and the backup power source;
    a voltage measurement device electrically connected to the resistive load;
    a current measurement device electrically connected to the resistive load;
    an accelerometer;
    a communications device;
    wherein the accelerometer measures the orientation of the solar power diagnostic tool; wherein the backup power source stores energy to emulate the solar power generation device and provides power to subsequent solar power generation devices when the IV curve of the solar power generation device under test is being swept;
    wherein once the backup power source is charged, the microcontroller switches the backup power source into the resistive load, and then switches the solar power generation device under test out of the resistive load;
    wherein the solar power diagnostic tool is fully automated and provides continuous power supply to the resistive load while the solar power generation device is under test; and
    wherein the communications device transports data from the solar power diagnostic tool.

2. The solar power diagnostic tool of claim 1 wherein the solar power generation device comprises a group of solar photovoltaic modules connected in series.

3. The solar power diagnostic tool of claim 1 wherein the solar power generation device comprises a group of solar photovoltaic modules connected in parallel.

4. The solar power diagnostic tool of claim 1 wherein the backup power source comprises a capacitor.

5. The solar power diagnostic tool of claim 1 wherein the backup power source comprises a battery.

6. The solar power diagnostic tool of claim 1 wherein the backup power source comprises a transistor.

7. The solar power diagnostic tool of claim 6 wherein the resistive load is created by said transistor.

8. The solar power diagnostic tool of claim 1 wherein the communications device comprises a wireless transceiver.

9. The solar power diagnostic tool of claim 1 comprising a waterproof assembly containing circuitry and the backup power source.

10. The solar power diagnostic tool of claim 1 wherein the circuitry resides in a combiner box or enclosure other than a waterproof assembly.

11. The solar power diagnostic tool of claim 1 comprising a bypass diode that passes solar string current if the solar power diagnostic tool fails in an open-circuit state.

12. The solar power diagnostic tool of claim 1 wherein the resistive load comprises field-effect transistors (FETs) which cause the solar power generation device under test to operate in the power quadrant from an open-circuit to within a small limit of a short-circuit.

13. The solar power diagnostic tool of claim 1 wherein the resistive load comprises capacitors.

14. The solar power diagnostic tool of claim 1 comprising inputs for temperature sensing devices for ambient temperature and module temperature.

15. The solar power diagnostic tool of claim 1 wherein the current is measured using a Hall effect.

16. A method for acquiring current-voltage (IV) curve traces of a solar power generation device comprising:
controlling the process, dataflow and timing of the solar power diagnostic tool;
storing energy to emulate a solar power generation device under test;
providing power to subsequent solar power generation devices when the IV curve of the solar power generation device under test is being swept;
measuring voltage of the solar power generation device under test as the resistive load is changing the voltage and current that the solar power generation device is operating under;
measuring current of the solar power generation device under test as the resistive load is changing the voltage and current that the solar power generation device is operating under; and
measuring orientation of the solar power diagnostic tool;
switching the backup power source into the resistive load once the backup power source is charged, and then switching the solar power generation device under test out of the resistive load;
providing continuous power supply to the resistive load while the solar power generation device is under test; and
communicating test data.

17. The method of claim 16 comprising passing solar string current via a bypass diode if the solar power diagnostic tool fails in an open-circuit state.

18. The solar power diagnostic method of claim 16 comprising measuring the current using a Hall effect measurement.

19. The solar power diagnostic method of claim 16 comprising communicating said test data wirelessly.

20. A method for acquiring current-voltage (IV) curve traces of a solar power generation device comprising:
charging a backup power source until the backup power source has a voltage equal to a solar power generation device under test, in a charging mode;
drawing just enough power to keep an internal power source of the solar power generation device charged, in a standby mode;
defining through software a trigger event that occurs at a regular interval that identifies a solar power diagnostic tool to perform a next step;
performing a switch event so that current from the backup source in a solar power diagnostic tool flows to a next device in a string of solar modules and current from the solar power diagnostic tool flows through the solar power diagnostic tool rather than to said string of solar modules;
varying a high power variable resistance at a speed determined by a microcontroller from open circuit to short circuit, while taking readings of the current-voltage operating points of the solar power generation device under test and storing data for transmission;
performing a switch event so that the current from the solar power generation device under test is reconnected to the string of solar modules and the current from the backup power source of the solar power diagnostic tool is disconnected from the string of solar modules; and
repeating until the solar power diagnostic tool is disconnected or turned off.

\* \* \* \* \*